US006498525B2

(12) United States Patent
Spurlin

(10) Patent No.: US 6,498,525 B2
(45) Date of Patent: Dec. 24, 2002

(54) CONFIGURABLE DUAL-SUPPLY VOLTAGE TRANSLATING BUFFER

(75) Inventor: James C. Spurlin, Sherman, TX (US)

(73) Assignee: Texas Instrument Incorporated, Dallas, TX (US)

( * ) Notice: Subject to any disclaimer, the term of this patent is extended or adjusted under 35 U.S.C. 154(b) by 0 days.

(21) Appl. No.: 10/010,405

(22) Filed: Dec. 5, 2001

(65) Prior Publication Data

US 2002/0075055 A1 Jun. 20, 2002

Related U.S. Application Data

(60) Provisional application No. 60/257,176, filed on Dec. 20, 2000.

(51) Int. Cl.[7] .................................................. H03L 5/00
(52) U.S. Cl. .......................................... 327/333; 326/81
(58) Field of Search ......................... 327/108–112, 333, 327/434, 436, 437; 326/80–83

(56) References Cited

U.S. PATENT DOCUMENTS

| | | | | |
|---|---|---|---|---|
| 5,929,687 A | * | 7/1999 | Yamauchi | 327/333 |
| 5,966,032 A | * | 10/1999 | Elrabaa et al. | 326/84 |
| 6,366,124 B1 | * | 4/2002 | Kwong | 327/536 |

* cited by examiner

*Primary Examiner*—Kenneth B. Wells
(74) *Attorney, Agent, or Firm*—Alan K. Stewart; W. James Brady, III; Frederick J. Telecky, Jr.

(57) ABSTRACT

The voltage configurable circuit includes: a first transistor 20 having a first end coupled to a first power supply node VCCA; a second transistor 21 having a first end coupled to a second power supply node VCCB and cross-coupled with the first transistor 20; input buffers having input buffer supply nodes coupled to a second end of the first transistor 20 and a second end of the second transistor 21; a first output port A-port coupled to a first one of the input buffers; and a second output port B-port coupled to a second one of the input buffers.

14 Claims, 2 Drawing Sheets

CONFIGURABLE DUAL-SUPPLY VOLTAGE TRANSLATING BUFFER

This application claims priority under 35 USC §119 (e) (1) of provisional application No. 60/257,176 filed Dec. 20, 2000.

FIELD OF THE INVENTION

This invention generally relates to electronic systems and in particular it relates to a configurable voltage translating buffer.

BACKGROUND OF THE INVENTION

A dual power supply system involves two sets of logic levels. Signal levels to the control inputs of a translating buffer can be incompatible with the buffer threshold, resulting in high power dissipation and/or nonfunctionality.

In a traditional prior art voltage translating buffer, one data port's inputs are referenced to the first power supply voltage VccA and the other port's inputs are referenced to the second power supply voltage VccB. The supply voltage that the control inputs are referenced to is an arbitrary hardwired choice made by the chip designer. Some prior art devices are offered in two versions, one with the control input referenced to VccA, and the other referenced to VccB. The end user has to make sure that the control signal logic levels are compatible with that arbitrarily chosen reference.

If the user applies voltage swings whose input high voltage Vih is higher than the reference, then there is no problem, assuming the inputs are overvoltage tolerant. However, since the input threshold is set lower than the midpoint of the incoming signal, the applied signal should swing rail to rail to maximize noise margins.

But if the user applies signal swings whose Vih is lower than the reference, then the input buffer is in a high static current mode because it is not biased fully off. This state is commonly known as the delta-Icc condition. This can cause high power dissipation, especially in situations where the control inputs are biased high most of the time.

SUMMARY OF THE INVENTION

A voltage configurable circuit includes: a first transistor having a first end coupled to a first power supply node; a second transistor having a first end coupled to a second power supply node and cross-coupled with the first transistor; input buffers having input buffer supply nodes coupled to a second end of the first transistor and a second end of the second transistor; a first output port coupled to a first one of the input buffers; and a second output port coupled to a second one of the input buffers.

DETAILED DESCRIPTION OF PREFERRED EMBODIMENTS

Figure 1:
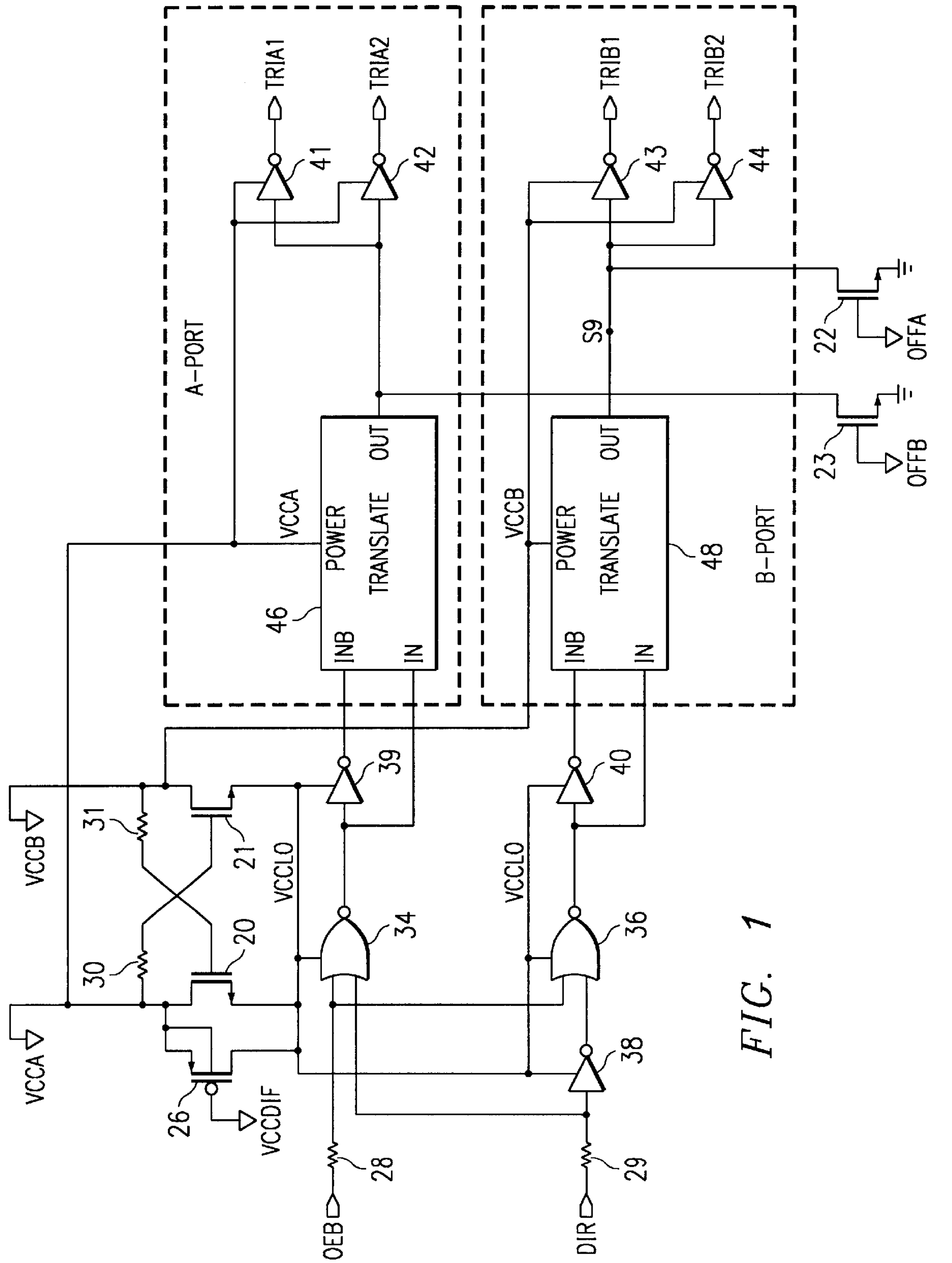
FIGS. 1 and 2 are a schematic circuit diagram of a preferred embodiment voltage configurable circuit.

The input buffer of the preferred embodiment circuit of FIG. 1 has a threshold which is referenced to the lower voltage of the two power supplies. This allows the system designer to use control signals from either logic system. By referencing the control inputs to the lower of the two supplies, the user is free to apply either of the two supply voltages VccA and VccB referenced signal levels without causing a delta-Icc problem, thus enabling a fully configurable voltage translating buffer. This eliminates the need to include additional control signal translation.

Figure 2:
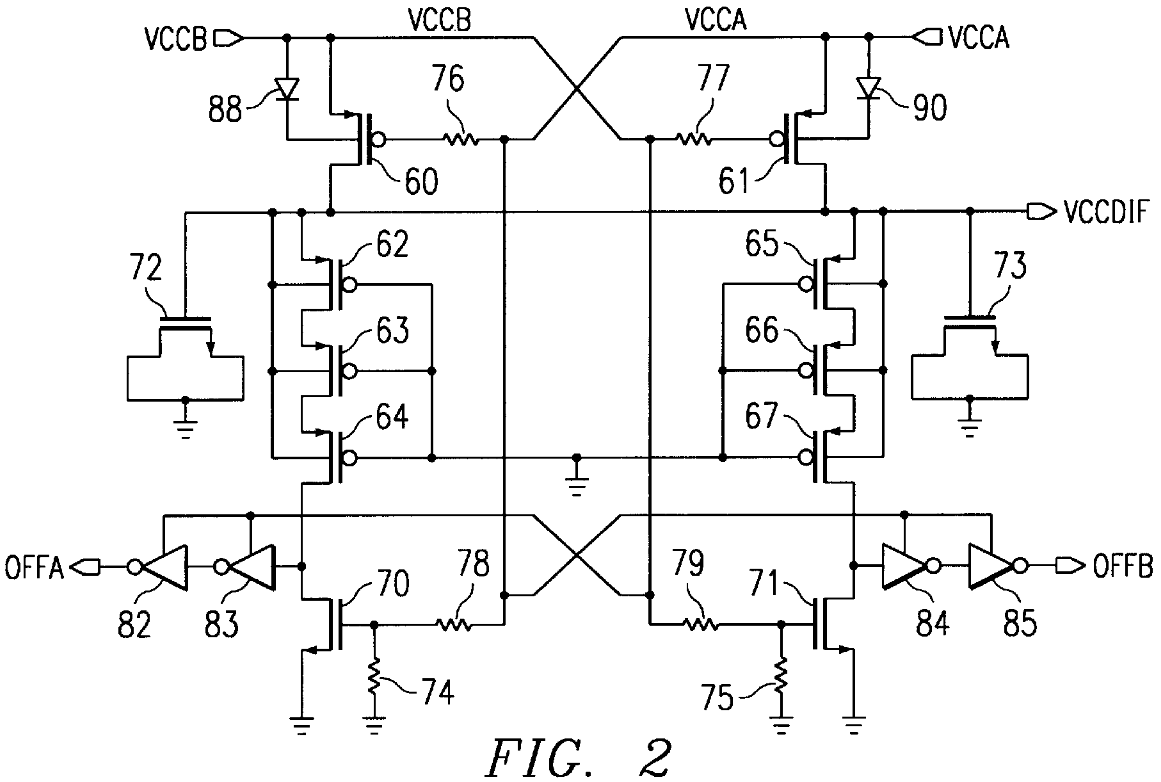

The preferred embodiment voltage configurable circuit is shown in FIGS. 1 and 2. The circuit of FIG. 1 includes N type transistors 20–23; P type transistor 26; resistors 28–31; NOR gates 34 and 36; inverters 38–44; translate circuits 46 and 48; supply voltages VccA and VccB; node VCCLO; node VCCDIF; input signals oeb and dir; outputs tria1, tria2, trib1, and trib2; and nodes OFFA and OFFB. The input signal oeb is an inverted output enable signal. The input signal dir is a direction signal for determining which port becomes active. The input buffers (inverters 38–40 and NOR gates 34 and 36) of the circuit of FIG. 1 are powered by the node VCCLO. The voltage at node VCCLO is set to the lower of power supply voltages VccA and VccB. This is done by the cross-coupled transistors 20 and 21. (Resistors 30 and 31 are included for ESD protection and do not affect the operation of the circuit).

For example, if supply voltage VccA=3.3V and supply voltage VccB=2.5V, then node VCCLO rises to 2.5V. Transistor 21 has a gate-to-source voltage (Vgs) of +0.8V, and is ON, coupling the lower Vcc (VccB) to node VCCLO. Node VCCLO will not rise above 2.5V because transistor 20 has a Vgs of 0V, blocking the higher Vcc (VccA) from node VCCLO and isolating current flow between the two supplies. With a low-Vt (low threshold voltage) process and with proper transistor sizing for transistors 20 and 21, sufficient drive current can be supplied to the input buffers 34, 36, 38, 39, and 40, and the input threshold will be referenced to the lower of supply voltages VccA and VccB.

A special condition exists when supply voltages VccA and VccB are equal. If voltages VccA and VccB are equal, then both transistors 20 and 21 have equal gate voltages, and therefore node VCCLO can rise only to Vcc−Vt. This causes the input threshold to be referenced one Vt below the desired level. This is not critical at the higher Vcc's such as 3.3V, but becomes significant at lower Vcc's such as 1.2V. To solve this problem, transistor 26 was added to pull up node VCCLO to the full Vcc level.

The gate of transistor 26 is controlled by the voltage generated by the circuit of FIG. 2. The circuit of FIG. 2 includes P type transistors 60–67; N type transistors 70–73; resistors 74–79; inverters 82–85; diodes 88 and 90; voltage supplies VccA and VccA; output node Vccdif; and nodes offa and offb. Inverters 82 and 83 form a buffer. Inverters 84 and 85 form a buffer. The cross-coupled P channel configuration formed by transistors 60 and 61 in FIG. 2 is very similar to the cross-coupled N channel configuration of transistors 20 and 21 in FIG. 1 which generates the signal at node VCCLO, except the cross-coupled P channels generate the signal at node VCCDIF. As an example, when voltages VccA and VccB are both 3.3V, both transistors 60 and 61 have Vgs=0V, so they are both OFF. A weak current source formed by transistors 62–67, 70, and 71 pulls node VCCDIF low, which turns ON transistor 26 in FIG. 1, which pulls node VCCLO up to the full Vcc level. This sets the input buffer at the proper threshold voltage. Alternately, if voltages VccA and VccB are different by at least one Vt, either transistor 60 or 61 will turn ON, pulling node VCCDIF high. This turns OFF transistor 26 in FIG. 1, and allows node VCCLO to be set at the lower of supply voltage VccA or VccB as previously described. Resistors 74 and 78 form a resistor divider at the gate of transistor 70. Resistors 75 and 79 form a resistor divider at the gate of transistor 71. These resistor dividers cause transistors 70 and 71 to switch at a higher voltage than the logic devices in the remainder of the circuit. This prevents an indeterminate (or floating) logic state that would result in high power supply current. To minimize current, only one VCCDIF circuit, as shown in FIG. 2, is used on the chip. The signal on node VCCDIF in FIG. 2 can be routed to all circuits of the type shown in FIG. 1.

The circuits of FIGS. 1 and 2 are designed such that if either VccA or VccB is powered down to 0V while the other remains active, then the active port (A-port or B-port) will go 3-state. This is accomplished by transistors 70 and 71 in the circuit of FIG. 2, and transistors 22 and 23 in the circuit of FIG. 1. The weak current sources formed by transistors 62–67 in the circuit of FIG. 2 therefore perform dual functions, i.e., a weak pulldown for the node VCCDIF, and a weak pullup for the nodes OFFA and OFFB. In normal operation, i.e., both voltages VccA and VccB are active, the circuit of FIG. 2 operates as described above, and both transistors 70 and 71 are ON. This drives nodes OFFA and OFFB low, which keeps transistors 22 and 23 of FIG. 1 off such that they do not disturb the signal path. However, if voltage VccA powers down to 0V, then node OFFA will rise to a high level equal to voltage VccB. Node OFFA then drives transistor 22 on, forcing node S9 low, which drives the B-port outputs Trib1 and Trib2 into 3-state.

Figure 3:
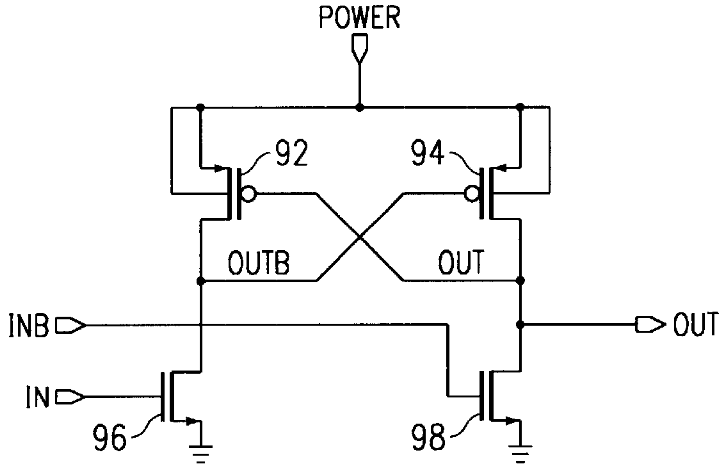
FIG. 3 is a schematic circuit diagram of the translate circuits of FIG. 1.

FIG. 3 is a circuit diagram of the translate circuits 46 and 48 of FIG. 1. Each of the translate circuits 46 and 48 is a latch formed by cross-coupled P channel transistors 92 and 94, along with input N channel transistors 96 and 98, as shown in FIG. 3. When one of the supply voltages VccA or VccB is low, both inputs Inb and In of the TRANSLATE circuit 48 are low because node VCCLO is low. This puts the latch 48 in an indeterminate, possibly high current state. Transistor 22 pulls down the latch output at node s9, setting it to a known low-current low-voltage state.

The preferred embodiment solution of FIGS. 1 and 2 allows the use of either logic level to control the translating buffer. Without this solution, an incompatible logic signal may be used which would result in increased power dissipation and could require additional translation circuitry. An advantage of this preferred embodiment input buffer is that it automatically adjusts the input threshold to be compatible with the lower of the two system logic levels. Since the buffer is also over-voltage tolerant, it will function with either logic level. Additional translation circuitry and two buffer versions are not required. This allows decreased power dissipation.

While this invention has been described with reference to an illustrative embodiment, this description is not intended to be construed in a limiting sense. Various modifications and combinations of the illustrative embodiment, as well as other embodiments of the invention, will be apparent to persons skilled in the art upon reference to the description. It is therefore intended that the appended claims encompass any such modifications or embodiments.

What is claimed is:

1. A circuit comprising:

a first transistor having a first end couple to a first power supply node;

a second transistor having a first end coupled to a second power supply node and cross-coupled with the first transistor;

input buffers having input buffer supply nodes coupled to a second end of the first transistor and a second end of the second transistor;

a first output port coupled to a first one of the input buffers, wherein the first output port has a first output port supply node coupled to the first power supply node; and a second output port coupled to a second one of the input buffers, wherein the second output port has a second output port supply node coupled to the second power supply node.

2. The circuit of claim 1 wherein the first output port comprises a first translate circuit coupled to the first one of the input buffers; and the second output port comprises a second translate circuit coupled to the second one of the input buffers.

3. The circuit of claim 1 further comprising a third transistor coupled in parallel with the first transistor.

4. The circuit of claim 3 further comprising:

a fourth transistor coupled between a control node of the third transistor and the first power supply node; and a fifth transistor coupled between the control node of the third transistor and the second power supply node, the fifth transistor is cross-coupled with the fourth transistor.

5. The circuit of claim 4 further comprising:

a first current source having a first end coupled to the control node of the third transistor;

a sixth transistor coupled to a second end of the first current source and having a control node coupled to the second power supply node;

a second current source having a first end coupled to the control node of the third transistor; and a seventh transistor coupled to a second end of the second current source and having a control node coupled to the first power supply node.

6. The circuit of claim 5 wherein the first and second current sources each comprises three transistors coupled in series, each of the three transistors having a control node coupled to a common node.

7. The circuit of claim 5 further comprising:

a first cut-off switch coupled to the first output port and having a control node coupled to the sixth transistor; and a second cut-off switch coupled to the second output port and having a control node coupled to the seventh transistor.

8. The circuit of claim 7 further comprising:

a first buffer circuit coupled between the control node of the first cut-off switch and the sixth transistor, the first buffer circuit having a first input supply node coupled to the first power supply node; and a second buffer circuit coupled between the control node of the second cut-off switch and the seventh transistor, the second buffer circuit having a second input supply node coupled to the second power supply node.

9. The circuit of claim 8 wherein the first and second buffer circuits each comprises two inverters coupled in series.

10. The circuit of claim 1 wherein the first and second transistors are NMOS transistors.

11. The circuit of claim 1 wherein each of the input buffers comprises:

a NOR gate; and an inverter coupled in series with the NOR gate.

12. The circuit of claim 11 further comprising:

an output enable node coupled to a first input of the NOR gate; and a direction signal node coupled to a second input of the NOR gate.

13. The circuit of claim 1 further comprising a first cut-off switch coupled to the first output port and a second cut-off switch coupled to the second output port.

14. The circuit of claim 13 wherein the first and second cut-off switches are transistors.

* * * * *

UNITED STATES PATENT AND TRADEMARK OFFICE
CERTIFICATE OF CORRECTION

PATENT NO. : 6,498,525 B2
DATED : December 24, 2002
INVENTOR(S) : James C. Spurlin It is certified that error appears in the above-identified patent and that said Letters Patent is hereby corrected as shown below:

Title page,
Item [73], should read:
-- Texas Instruments Incorporated, Dallas, TX (US) --.

Signed and Sealed this

Twenty-second Day of April, 2003

JAMES E. ROGAN
*Director of the United States Patent and Trademark Office*